(12) United States Patent
Jaouen et al.

(10) Patent No.: US 6,208,551 B1
(45) Date of Patent: Mar. 27, 2001

(54) MEMORY CIRCUIT ARCHITECTURE

(75) Inventors: Hervé Jaouen, Meylan; Richard Ferrant, Saint Ismier, both of (FR)

(73) Assignee: STMicroelectronics S.A., Gentilly (FR)

(*) Notice: Subject to any disclaimer, the term of this patent is extended or adjusted under 35 U.S.C. 154(b) by 0 days.

(21) Appl. No.: 09/425,763

(22) Filed: Oct. 22, 1999

(30) Foreign Application Priority Data

Oct. 23, 1998 (FR) .................................. 98 13546

(51) Int. Cl.$^7$ .................................. G11C 11/24

(52) U.S. Cl. .................................. 365/149

(58) Field of Search .................................. 365/149, 150; 257/256, 206

(56) References Cited

U.S. PATENT DOCUMENTS

| | | | |
|---|---|---|---|
| 5,243,209 | 9/1993 | Ishii | 257/263 |
| 5,393,998 | 2/1995 | Ishii et al. | 257/256 |
| 5,739,576 | 4/1998 | Shirley et al. | 257/532 |
| 5,801,412 * | 9/1998 | Tobita | 257/206 |
| 5,949,705 * | 9/1999 | Jun et al. | 365/149 |

* cited by examiner

Primary Examiner—Andrew Tran
Assistant Examiner—Anh Phung
(74) Attorney, Agent, or Firm—Wolf, Greenfield & Sacks, P.C.; James H. Morris; Theodore E. Galanthay

(57) ABSTRACT

A DRAM made in monolithic form, the cells of which each include a MOS transistor and a capacitor, a second electrode of which is common to all cells of a same row and is covered with an insulator, the insulator being coated with independent conductive elements distributed on a same horizontal plane, two neighboring elements being biased to respective high and low levels.

4 Claims, 2 Drawing Sheets

MEMORY CIRCUIT ARCHITECTURE

BACKGROUND OF THE INVENTION

1. Field of the Invention

The present invention generally relates to memory cells. More specifically, the present invention relates to memory cells of DRAM type compatible with a method of manufacturing a device incorporating such a memory and CMOS components.

2. Discussion of the Related Art

Conventionally, a DRAM appears as an array of columns and rows at the intersections of which are memory cells formed of a memory element, typically a capacitor, and of a switch for controlling this memory element, typically a MOS transistor.

FIG. 1 shows a portion of an equivalent diagram of such a memory. More specifically, FIG. 1 15 illustrates the equivalent electric diagram of one of the memory rows. Among the n cells of the considered row, the first and last memory cells 1 and n have been shown. Cells 1 and n respectively include a capacitor C1, Cn, a first electrode of which is connected to the drain of a respective control transistor M1, Mn, and a second electrode of which is common to the n cells. The gate of transistor M1, Mn is connected to a word line WL1, WLn of the considered cell and its source is connected to a bit line BL1, BLn, of the considered cell. The drain/substrate junctions of each of transistors M1, Mn, shown in FIG. 1 by diodes D1, Dn, ensure the storing of the information in memory element C1, Cn when the considered cell is not addressed in the write mode.

A conventional memory array includes a number n of rows and a number m of columns. IThe simple case in which n and m are equal, for example, n=m=1024, will be considered hereafter. Then, for each of the rows, identical to that shown in FIG. 1, the n-1 other rows of n memory cells form an equivalent capacitor Ceq, a first electrode of which is common to the common electrode of the n memory cells of the selected row, and a second electrode of which is grounded.

The electrode common to the n elements C1, Cn of the considered row and to capacitor Ceq is connectable to a first power supply capable of biasing it to a write potential Vdd when data have to be stored in a memory element.

Finally, outside write periods, the electrode common to the n elements C1, Cn of the considered row and to capacitor Ceq is precharged by a D.C. power supply V. Precharge voltage V may have any value, greater than the circuit ground potential and smaller than high write potential Vdd, but has to be very stable. A value equal to Vdd/2 is typically chosen, to decrease breakdown risks for the inter-electrode oxide during a switching to the ground potential as tile row is deselected.

A disadvantage of this type of structure is that, upon variation of the charge of capacitors C1, Cn, a relatively high positive or negative current surge appears, for example on the order of 5 mA, for a relatively long duration, on the order of 3 ns, for a 1-megabit memory. A relatively large voltage difference then appears across the considered row, for example, on the order of 0.25 V. Then, given the great number of capacitors which can be charged at the same time, such a phenomenon can affect the supplies which have to withstand such a positive or negative surge. Similarly, the circuit ground, common to all elements, is affected by such surges. In an extreme case, the propagation of such disturbances can affect one or several memory nodes and cause corruption of the stored data.

SUMMARY OF THE INVENTION

An object of the present invention is to provide a DRAM in which the power supplies and the ground are protected from charge variations of the memory elements.

To achieve this and other objects, the present invention provides a DRAM made in monolithic form, the cells of which each include a MOS transistor and a capacitor, a second electrode of which is common to all cells of a same row and is covered with an insulator, wherein the insulator is coated with independent conductive elements distributed on a same horizontal plane, two neighboring elements being biased to respective high and low levels.

According to an embodiment of the present invention, the low potential is the reference potential of the circuit in which the cell is formed.

According to an embodiment of the present invention, the high potential is the write potential of the memory cell.

The foregoing objects, features and advantages of the present invention, will be discussed in detail in the following non-limiting description of specific embodiments in connection with the accompanying drawings.

DETAILED DESCRIPTION

Figure 3:
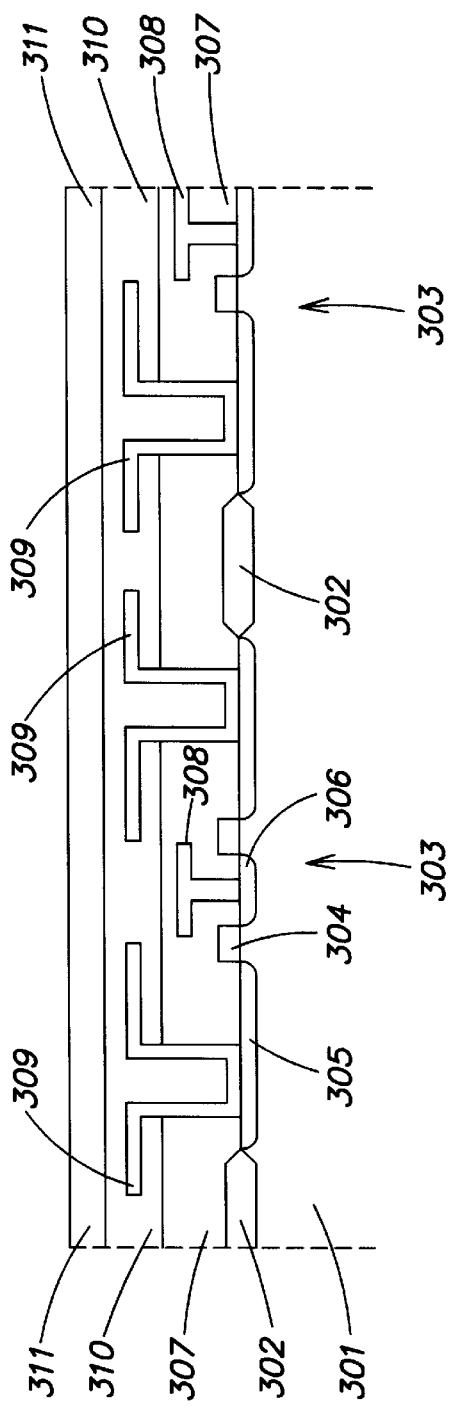
FIG. 3 is a simplified cross-sectional view of a portion of a monolithic embodiment of a row of a DRAM array.
Figure 4:
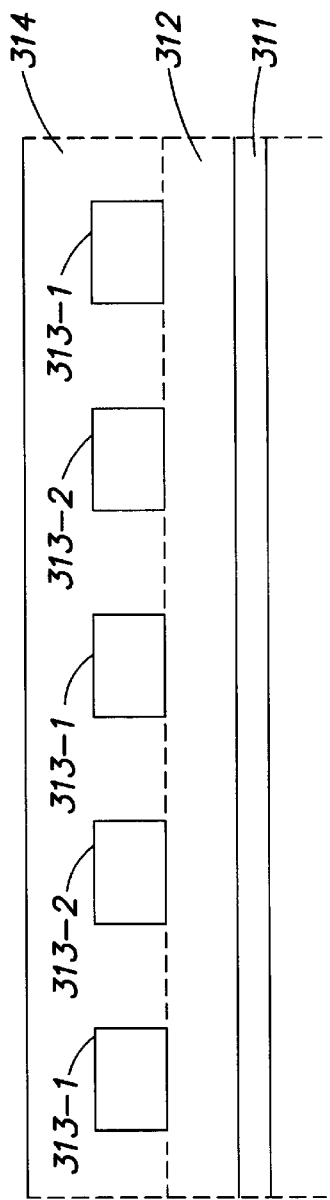
FIG. 4 is a simplified cross-sectional view of a portion of a monolithic embodiment of bypass capacitors according to the present invention.

The same elements have been referred to with the same references in the different drawings. For clarity, only those elements necessary to the understanding of the present invention have been shown in the drawings and will be described hereafter. Further, as is conventional in the field of the representation of integrated circuits, FIGS. 3 and 4 are not drawn to scale but their dimensions have been arbitrarily expanded to improve the readability of the drawings.

A feature of the present invention is to stabilize the supplies of a common electrode of the memory elements by means of several bypass capacitors.

Figure 2:
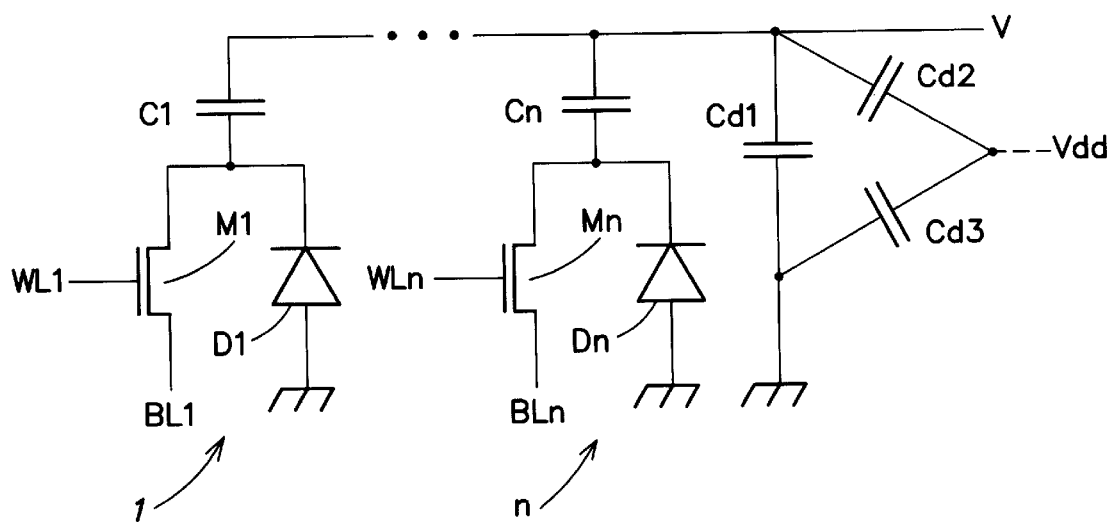
FIG. 2 shows the equivalent diagram of a row of a DRAM array according to the present invention.

FIG. 2 shows the equivalent diagram of a row of DRAM cells of a memory array with n rows and n columns according to the present invention.

Figure 1:
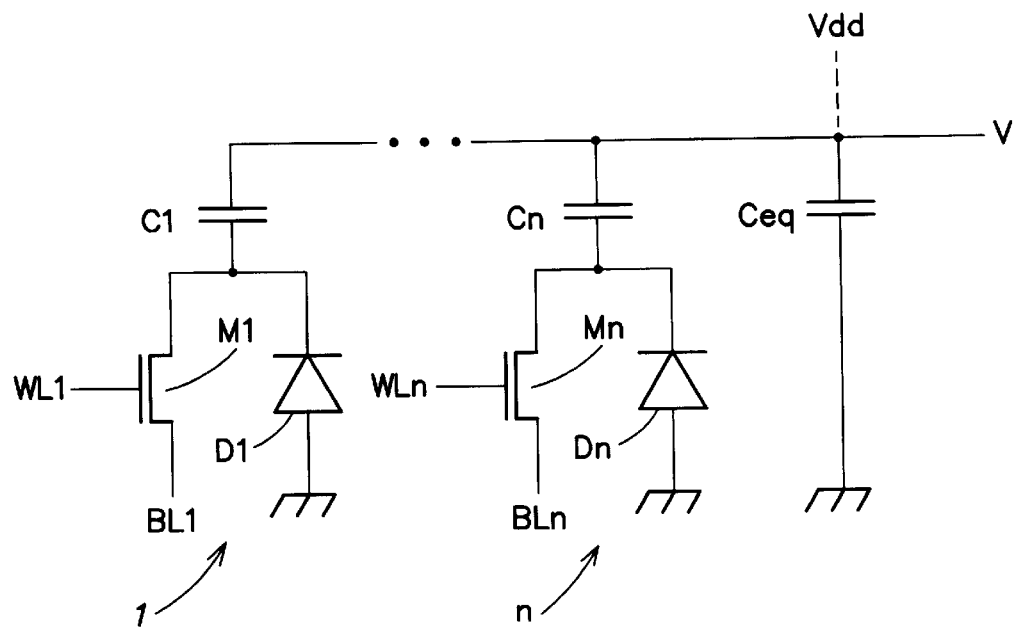
FIG. 1 shows the equivalent diagram of a row of a conventional DRAM an-ay.

Such a row includes, like a conventional row (FIG. 1), n memory cells. Each cell includes a capacitor C1, Cn, a first electrode of which is connected to the drain of a respective MOS control transistor M1, Mn, and a second electrode of which is common to the n elements. Transistors M1, Mn are connected and shown in FIG. 2 in the same way as the elements of same references in FIG. 1.

The memory row according to the present invention is associated with three capacitors Cd1, Cd2, and Cd3 connected in a triangle. Capacitor Cd1 is connected between the common electrode of memory elements C1, Cn and the ground. Capacitor Cd2 is connected between the common electrode of memory elements C1, Cn and a write supply at Vdd. Capacitor Cd3 is connected between the ground and the supply at Vdd.

The common electrode of memory elements C1, Cn, which is thus also an electrode of capacitor Cd1 and an electrode of capacitor Cd2, is also connected to a stable supply V, for example, identical to the previously-described precharge supply at Vdd/2.

Capacitors Cd1, Cd2, and Cd3 according to the present invention each ensure a bypass function which will be detailed hereafter.

The present invention more specifically applies to memories which, as they are made in monolithic form, include an electrode common to the n cells of a substantially planar row, whatever the way in which the other elements (MOS control transistors, first electrodes, etc.) are formed.

FIG. 3 illustrates, in a simplified cross-sectional view, an embodiment of such a memory on a semiconductor substrate 301. On substrate 301, typically made of silicon, thick field oxide regions 302 define active areas 303. Each active area 303 includes a pair of MOS transistors including an insulated gate 304 and source and drain regions 305 and 306. The MOS transistors of a given pair have a common drain region 306. An insulating layer 307, typically made of silicon oxide, Covers these transistors as well as contacts 308 of drain region 306. The memory elements are capacitor structures supporting a first electrode 309 formed of a hollowed base, in contact with the source region 305 of a MOS transistor, and of a substantially horizontal plate. The memory capacitors also include a very thin dielectric (not shown), and a second electrode common to the n capacitors of a row. The second electrode is, for example, formed of a continuous conductive layer 310, for example, made of polysilicon, and of a first continuous metal layer 31 1, for example, made of tungsten. It should be noted that layers 310 and 311 are electrically connected. The upper portion of this second electrode is substantially planar.

According to the present invention, any memory having its rows including a substantially planar common electrode, for example, similar to that of FIG. 3, will be completed as described hereafter in relation with FIG. 4.

FIG. 4 illustrates, in a simplified cross-sectional view, a portion of the realization in monolithic form of the bypass capacitors of a memory row according to the present invention.

The memory row according to the present invention includes a second conventional substantially planar electrode 311, common to the n cells of the row. An insulating layer 312, for example, made of silicon oxide, covers electrode 311.

According to the present invention, insulating layer 312 is covered with distinct and alternated conductive elements 313-1 and 313-2. Elements 313-1 and 313-2 are formed by deposition and etching of a conductive layer, preferably made of metal, for example, aluminum. The conductive elements are, preferably, coated with an insulating layer, preferably planarized, above which are formed other conductive levels (not shown).

According to the present invention, elements 313-1 are biased to the reference potential (ground) of the circuit and elements 313-2 are biased to high potential Vdd. Capacitors Cd1, Cd2, and Cd3 of FIG. 2 are thus formed. Capacitor Cd1 is formed between the second electrode 311 and elements 313-1. Capacitor Cd2 is formed between second electrode 311 and elements 313-2. Capacitor Cd3 has as first and second electrodes elements 313-1 and 313-2, respectively. The dielectric of each of these capacitors is formed of insulating layer 312.

The capacitance of each of capacitors Cd1, Cd2, and Cd3 is determined by the nature and the dimension of elements 313-1 and 313-2. In practice, it should be noted that die spacing between two elements 313-1 and 313-2 has to be smaller than the spacing between these elements and conductive layer 311, for the capacitance of capacitor Cd3 to be sufficiently high.

An advantage of the present invention is to protect, by capacitors Cd1 and Cd3, first electrode supplies Vdd and V from current jumps.

Another advantage of the present invention is to protect, by capacitor Cd2, supplies Vdd and V from each other.

Another advantage of the present invention is to provide such capacitors Cd1, Cd2, and Cd3, tile capacitances of which are perfectly well known. Indeed, their capacitances are determined by the surface ratios of each of their electrodes and the thickness of the dielectric separating them as well as the features of the materials forming them, conversely to the capacitance of natural stray capacitor Ceq, the value of which varies according to the programmed or unprogrammed state of the other array memory cells.

It should be noted that, for a memory array of 1024 rows by 1024 columns, the capacitance of equivalent capacitor Ceq, on the order of 62 pF, is negligible as compared to the capacitance of capacitor Cd1, on the order of 145 pF.

According, to an embodiment of the present invention, elements 313-1 and 313-2 have a surface of 1.55 $\mu$m by 2.8 $\mu$m for an insulating layer 312 of 9 $\mu$m, the capacitance of capacitor Cd1 is substantially 145 pF, the capacitance of capacitor Cd2 is substantially 166 pF, and the capacitance of capacitor Cd3 is substantially 166 pF.

Of course, the present invention is likely to have various alterations, modifications, and improvements which will readily occur to those skilled in the art. In particular, the nature and the dimensions of elements 313-1 and 313-2 forming the conductive plane according to the present invention can be modified to modify the value of the capacitances of the bypass capacitors. For example, the capacitances of capacitors Cd1 and Cd3 may be different. Further, the various elements forming the memory may have any structure, as long, as the memory capacitors have a substantially planar second upper electrode. Further, although the present invention has been illustrated by means of a square array of n rows and n columns, it applies to any memory array of n rows and m columns, whatever n and m.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A monolithic DRAM memory that includes a plurality of cells, each respective cell of the plurality of cells including a MOS transistor and a capacitor, the capacitor of each respective cell having a first electrode that contacts a selected region of an underlying substrate of the memory and a second electrode that faces the first electrode and is separated from the first electrode by a dielectric, wherein the second electrode of each capacitor is common to each respective cell of a same row and is covered with an insulator, and wherein the insulator is coated with independent conductive elements distributed on a same horizontal plane, with two neighboring elements being biased to respective high and low potentials.

2. The memory of claim 1, wherein the low potential is a reference potential of the memory.

3. The memory of claim 1, wherein the high potential is a write potential of the memory.

4. The memory of claim 2, wherein the high potential is a write potential of the memory.

* * * * *